Nov. 26, 1968 B. T. MURPHY 3,413,495

HIGH NOISE MARGIN LOGIC CIRCUIT FEEDBACK RESISTOR

Filed Jan. 6, 1965

INVENTOR
B. T. MURPHY
BY Lucian C. Canepa
ATTORNEY

3,413,495
HIGH NOISE MARGIN LOGIC CIRCUIT FEEDBACK RESISTOR

Bernard T. Murphy, New Providence, N.J., assignor to Bell Telephone Laboratories, Incorporated, New York, N.Y., a corporation of New York Filed Jan. 6, 1965, Ser. No. 423,694
8 Claims. (Cl. 307—272)

ABSTRACT OF THE DISCLOSURE

A logic circuit exhibiting high noise margins includes an emitter-input transistor having a feedback element connected between the base and collector electrodes thereof. When the transistor is in its energized state, the value of the current that flows through this element is relatively large. Associated circuitry characterized by a predetermined breakdown voltage is connected to the collector electrode of the transistor. When the voltage applied to the emitter electrode of the transistor is increased to a predetermined value sufficient to break down the associated circuitry, the transistor is thereby de-energized and current flow through the feedback element is reduced to a relatively low value. To re-energize the transistor, and thereby de-energize the associated circuitry, the voltage applied to the emitter electrode of the transistor must be reduced to a value that is less than the predetermined value.

This invention relates to logic circuits and more particularly to reliable logic circuits which exhibit a high immunity to spurious input signals.

Electrical circuits whose output states are related in a predefined manner to the input signals applied thereto are employed extensively in switching, translating and processing systems to perform a variety of logical functions therein. Reliable operation of such circuits is invariably of crucial importance to the over-all functioning of the systems of which they are a part. In particular, such operation requires that the circuits respond positively to applied control signals while ignoring or not changing state in response to spurious or noise signals applied thereto.

If a logic circuit is characterized by a particular switching threshold, and if an input signal whose maximum magnitude is twice that threshold is applied to the circuit to switch it between its stable states, the circuit may be said to exhibit a noise margin of one-half or fifty per cent. In other words, any spurious signal whose magnitude equals or exceeds fifty per cent of the maximum amplitude of an input singal may be effective to switch the circuit and thereby inhibit its intended mode of operation.

An object of the present invention is to improve logic circuits.

More specifically, an object of this invention is an improved logic circuit which is characterized by a high degree of reliability.

Another object of the present invention is a reliable logic circuit which is characterized by a high noise margin and relative simplicity of design.

These and other objects of the present invention are realized in a specific illustrative circuit embodiment thereof that comprises interconnected input, intermediate and output transistors. The collector electrode of the input transistor is directly connected to the base electrode of the intermediate transistor, and the emitter electrode of the intermediate transistor is connected to the base elecrode of the output transistor. A feedback resistor interconnects the base and collector electrodes of the input transistor.

Input signals are applied to the emitter electrode of the input transistor, and output signals are abstracted from the collector electrode of the output transistor. In one quiescent stable state of the circuit the input transistor is energized and the intermediate and output transistors are in their relatively low conduction states. In the other stable state thereof the input transistor is de-energized and the other two units are in their relatively high conduction states.

To switch the circuit arrangement from the one stable state to the other, there must be supplied to the emitter of the input transistor a signal that exceeds a first threshold level. This first level approximates the additive forward breakdown voltages of the base-to-emitter junctions of the intermediate and output transistors. In the other hand, to switch the circuit back to the one stable state, the signal applied to the emitter of the input transistor must be decreased to a value below that of the first threshold level. Specifically, the input signal must be decreased therebelow by an amount that appproximates the base-to-emitter forward breakdown voltage of the input transistor.

Thus, in accordance with the principles of the present invention, there is provided a logic circuit which can be switched from the one to the other of its stable states by exceeding a first threshold level thereof and which can be switched back to the one or first state by decreasing the input singal to a second threshold level that is less than the first level. The immunity of such a circuit to spurious or noise signals is significantly greater than that of a similarly-driven circuit which exhibits a single threshold level.

It is a feature of the present invention that a logic circuit include interconnected input intermediate and output transistors and that the input signal threshold that must be exceeded to switch the output transistor from its relatively low to its relatively high conduction state be greater than the threshold at which the output transistor is switched from its relatively high to its relatively low conduction state.

It is another feature of this invention that the input transistor of a three-transistor logic circuit include a feedback resistor connected between the base and collector electrodes thereof, and that switching signals be applied to the emitter electrode of the input transistor.

Still another feature of the present invention is that the feedback resistor connected between the base and collector electrodes of the input transistor be included in a feedback path between the collector and base electrodes of the intermediate transistor, whereby the potential drop across the feedback resistor is relatively large when the intermediate transistor is de-energized and is relatively small when the intermediate transistor is energized.

A complete understanding of the present invention and of the above and other features and advantages thereof may be gained from a consideration of the following detailed description of an illustrative embodiment thereof presented hereinbelow in connection with the accompanying drawing, in which.

Figure 1:
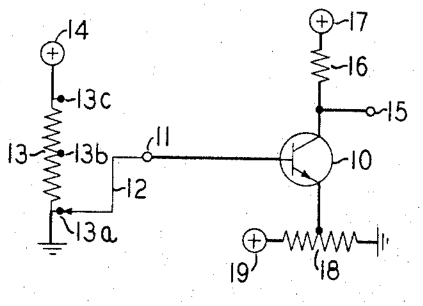
FIG. 1 PRIOR ART
FIG. 1 illustrates a prior art circuit arrangement that exhibits a single switching threshold.

The prior art circuit shown in FIG. 1 includes a transistor 10 having base, emitter and collector electrodes. The base electrode is connected to an input terminal 11 which, in turn, is connected to a movable arm 12 that is adapted to contact an input resistor 13. The upper end of the resistor 13 is connected to a source 14 of positive potential and the lower end thereof is connected to ground.

The collector electrode of the transistor 10 shown in FIG. 1 is connected to an output terminal 15 and, in addition, is connected via a collector resistor 16 to a source 17 of positive potential. The emitter electrode of the unit 10 is connected to a tap point on a resistor 18 whose left-hand end is connected to a positive bias source 19 and whose right-hand end is connected to ground.

The source 19 and the resistor 18 shown in FIG. 1 serve to bias the emitter electrode of the transistor 10 at a predetermined positive potential $V_B$ with respect to ground. Accordingly, with the movable arm 12 connected to a bottom-most or ground tap 13*a* shown in FIG. 1, the base-to-emitter junction of the transistor 10 is reverse-biased by an amount equal to $V_B$. In this condition of the circuit the transistor 10 is de-energized and the voltage with respect to ground of the output terminal 15 is equal to the voltage of the source 17. This output voltage level, designated $V_1$, is indicated on the ordinate of FIG. 2. Correspondingly, the input voltage $V_{IN}$ (or $V_{MIN\ 1}$) is equal to zero, due to the arm 12 being initially in contact with the ground tap 13*a*.

As the arm 12 of FIG. 1 is moved upward toward its final destination, the tap point 13*c*, an increasingly more positive voltage is applied to the input terminal 11. When the arm 12 contacts a midway tap point 13*b*, the input voltage $V_{IN}$ is sufficiently more positive than the positive emitter threshold voltage, that the base-to-emitter junction of the transistor 10 is broken down and the transistor 10 is at that time rendered conductive. This value of input voltage is designated $V_T$ on the abscissa of FIG. 1. As a result of the conduction of the transistor 10, the voltage of the output terminal 15 drops to a value that is less positive than the value of the source 17. This lower output voltage is designated $V_2$ on the ordinate of FIG. 2.

Figure 2:
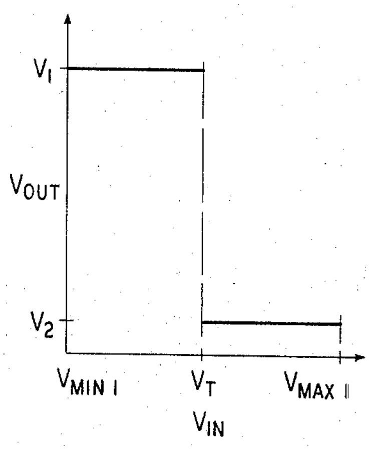
FIG. 2 shows the input-output switching characteristic of the circuit of FIG. 1.

The maximum input voltage applied to the terminal 11 of FIG. 1 corresponds to the arm 12 being in contact with the top-most tap point 13*c*. This maximum value of $V_{IN}$ is indicated in FIG. 2 by the designation $V_{MAX\ 1}$ and is twice the value represented by $V_T$.

Thus the output voltage of the circuit shown in FIG. 1 changes from a relatively high to a relatively low level in response to the application thereto of an input signal that exceeds a predetermined threshold value $V_T$. In a similar manner, as the arm 12 is moved downward from the tap 13*c*, $V_{IN}$ decreases. $V_{OUT}$ remains at its relatively low level $V_2$ until the tap 13*b* (corresponding to the threshold voltage $V_T$) is reached, at which point the transistor 10 is again de-energized and the voltage of the output terminal 15 rises to its relatively high level $V_1$.

It is seen that the prior art circuit of FIG. 1 is characterized by a single switching threshold. Furthermore, if the circuit is in its relatively high output voltage state, it is evident that any positive noise signal applied to the terminal 11 can be effective to switch the transistor 10 if the noise signal equals or exceeds the threshold voltage $V_T$. Similarly, if the circuit is in its relatively low output voltage state, any negative noise signal whose amplitude exceeds $V_{MAX\ 1}-V_T$ can be effective to switch the transistor to its nonconducting condition. The noise margin of the circuit may be defined as $$\frac{V_T-V_{MIN\ 1}}{V_{MAX\ 1}-V_{MIN\ 1}}$$

which, for the particular case considered herein, has the value of one-half or fifty percent.

Figure 3:
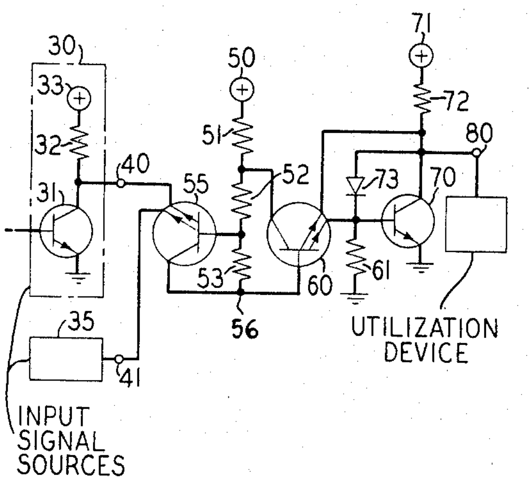
FIG. 3 depicts a specific illustrative circuit made in accordance with the principles of the present invention.
Figure 4:
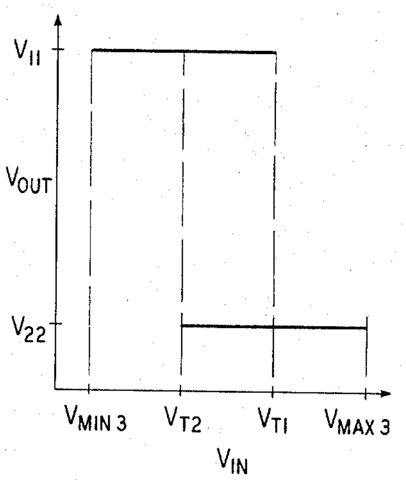
FIG. 4 is a representation of the input-output switching characteristic of the circuit of FIG. 3.

Referring now to FIG. 4, there is shown the input-output characteristic curve of the specific illustrative embodiment of the present invention that is depicted in FIG. 3. For comparison purposes, the voltage difference $V_{MAX\ 3}-V_{MIN\ 3}$ indicated in FIG. 4 has been selected to be equal to the corresponding quantity $V_{MAX\ 1}-V_{MIN\ 1}$ in FIG. 2. In other words, the maximum excursion of the input signal applied to the FIG. 3 circuit is assumed to be the same as that applied to the FIG. 1 circuit.

The FIG. 4 representation indicates that when the applied input voltage $V_{IN}$ has the value $V_{MIN\ 3}$, the value of the corresponding output voltage $V_{OUT}$ is the relatively high value $V_{11}$. As the input voltage is increased toward a first threshold value $V_{T1}$, the output voltage remains at the value $V_{11}$. When the first threshold level $V_{T1}$ is reached, the output voltage level switches to the relatively low value $V_{22}$ and remains there as the input voltage $V_{IN}$ increases further from $V_{T1}$ to its maximum value $V_{MAX\ 3}$.

As the input voltage $V_{IN}$ is decreased from its maximum value $V_{MAX\ 3}$, the output voltage of the circuit represented by FIG. 4 does not switch back to its relatively high level when the value $V_{T1}$ is reached. Instead, the input voltage must be decreased further to a value $V_{T2}$ before the circuit will so switch.

Assuming that the interval $$V_{MAX\ 3}-V_{T2} \text{ and } V_{T1}-V_{MIN\ 3}$$

indicated in FIG. 4 are equal, it is apparent that the noise margin of the circuit represented thereby, as defined by the expression $$\frac{V_{T1}-V_{MIN\ 3}}{V_{MAX\ 3}-V_{MIN\ 3}}$$

is greater than one-half. In other words, the amplitude of a spurious input signal must be greater than one-half of the maximum amplitude of an input control signal if the spurious signal is to effect an undesired switching of the circuit.

In fact, as the first threshold value $V_{T1}$ is moved upward to approach $V_{MAX\ 3}$, and as the second threshold value $V_{T2}$ is moved correspondingly downward to approach $V_{MIN\ 3}$, the noise margin of the circuit whose input-output characteristic is represented in FIG. 4 approaches one hundred percent. Clearly, the immunity of such a circuit to spurious input signals is significantly greater than that of a circuit of the type shown in FIG. 1.

As mentioned above, FIG. 3 depicts a specific illustrative embodiment of the principles of the present invention and exhibits an input-output characteristic curve of the form shown in FIG. 4.

FIG. 3 includes an input terminal 40 to which signals are applied from an illustrative switching stage 30. The stage 30 includes a grounded-emitter N-P-N transistor 31, a collector bias resistor 32 and a collector source 33. By means of appropriate signals applied to the base electrode of the transistor 31, the potential with respect to ground of the input terminal 40 is selectively controlled to be a relatively low positive value (the collector-to-emitter drop of the energized unit 30) or a relatively high positive value (the value of the bias source 33). The relatively low positive input signal applied to the terminal 40 of FIG. 3 corresponds to the value $V_{MIN\ 3}$ indicated in FIG. 4, and the relatively high positive signal applied to the input terminal 40 corresponds to the value $V_{MAX\ 3}$ of FIG. 4.

Assume that the transistor 31 shown in FIG. 3 is energized, thereby applying to the terminal 40 the relatively low positive input signal $V_{MIN\ 3}$. Under this condition current flows from a positive source 50 via resistors 51 and 52 into the base electrode of an input N-P-N transistor 55 and, in addition, via a resistor 53 into the collector electrode of the transistor 55. As a result, the potential with respect to ground of a node point 56 is approximately 0.6 volt, which is the sum of the collector-to-emitter drops of the transistors 55 and 31. This potential of 0.6 volt is insufficient to break down the base-to-emitter junction of an intermediate N-P-N transistor 60 which is, consequently, de-energized.

In turn, an output N-P-N transistor 70 is maintained in its relatively low conduction state in response to the de-energized condition of the intermediate transistor 60. Current flows from a positive source 71 via a resistor 72 through a clamping diode 73 and through a resistor 61 to ground. This causes output terminal 80 to be clamped at a relatively high voltage $V_{11}$ (FIG. 4) which is determined by the additive drops across the diode 73 and the resistor 61. Under these conditions, the drop across the resistor 61 causes a relatively small collector-to-emitter current flow through the output transistor 70 which is, therefore, maintained in a relatively low conduction condition.

It is noted that the input and intermediate transistors 55 and 60 are depicted in FIG. 3 as each having two emitters. Plural-emitter transistors of this general type are well known in the art, being described, for example, in "New Forms of All-Transistor Logic," by R. H. Beeson and H. W. Ruegg, pages 10–11, Proceedings of the 1962 International Solid State Circuits Conference.

The second emitter of the input transistor 55 may extend via another terminal 41 to another input source 35 of switching signals. In such an arrangement the input transistor 55 remains energized so long as any one of the input terminals 40 and 41 is maintained at a relatively low potential with respect to ground. Furthermore, still additional emitters may be added to the transistor 55 to provide for multiple-input control of the unit 55. (The purpose of the extra emitter on the intermediate transistor 60 is described hereinbelow in connection with a discussion of the relatively high conduction state of the output transistor 70.)

Assume now that the input voltage $V_{IN}$ applied to the terminal 40 shown in FIG. 3 is increased from the value $V_{MIN\,3}$ toward the first threshold level $V_{T1}$. As the emitter potential of the input transistor 55 becomes more positive with respect to ground, the potential of the node point 56 also rises, as does that of the base electrode of the transistor 55. Hence, the base-to-emitter junction of the transistor 55 remains forward-biased and the unit 55 accordingly remains energized. In particular, the base electrode of the unit 55 remains more positive than the emitter thereof by an amount that exceeds the breakdown voltage of the base-to-emitter junction of the unit 55.

When the voltage $V_{IN}$ applied to the input terminal 40 shown in FIG. 3 reaches the value $V_{T1}$, typically about 1.2 volts, the voltage of the node point 56 is sufficient to exceed the base-to-emitter drop of the energized intermediate transistor 60 plus the breakdown voltage of the base-to-emitter junction of the output transistor 70. At that point the unit 70 conducts relatively heavily and the voltage of the output terminal 80 drops to a relatively low voltage $V_{22}$.

The output voltage $V_{22}$ of the FIG. 3 circuit is mainly determined by the additive drops appearing across the base-to-emitter diodes of the transistor 60 and the base-to-emitter diode of the energized output transistor 70. Therefore, the extra emitter connection on the intermediate transistor 60 is seen to be available as a diode connection to clamp the output voltage at approximately one diode drop above ground.

When the transistors 60 and 70, which, advantageously, are relatively high-gain units, are in their high conduction states, the current through the resistors 52 and 53 falls to a relatively small value. As a result, the voltage across the feedback resistor 53 falls to a very small level, typically about 0.04 volt. Consequently, the input transistor 55 is de-energized when the output voltage drops to the relatively low value $V_{22}$. This de-energization of the unit 55 occurs in approximate time coincidence with the application to the terminal 40 of an input signal of value $V_{T1}$. Eventually, the input voltage reaches the value $V_{MAX\,3}$ while the output voltage remains at the relatively low value $V_{22}$.

In the originally assumed or first quiescent state of the FIG. 3 circuit, the input transistor 55 is energized and the intermediate and output transistors are in their relatively low conduction states, whereby the output voltage is relatively high. On the other hand, in the second quiescent state described above, the input transistor 55 is de-energized and the other two units 60 and 70 are in their relatively high conduction states, whereby the output voltage is then relatively low.

In the second quiescent state of the specific circuit illustrated in FIG. 3, the voltage of the node point 56 is approximately two diode drops above ground. Since the resistor 53 has a very small drop thereacross, the base electrode of the input transistor 55 is also about two diode drops (illustratively, 1.6 volts) above ground. Therefore, as the voltage $V_{IN}$ applied to the input terminal 40 is decreased from the value $V_{MAX\,3}$ to the first threshold value $V_{T1}$, the transistor 55 remains de-energized. This is due to the fact that, as noted above, $V_{T1}$ illustratively approximates 1.2 volts. Hence the unit 55 is not rendered conductive until the input voltage decreases further—specifically, to a value which is sufficiently below $V_{T1}$ to equal (when subtracted from the aforementioned base potential of about 1.6 volts) the base-to-emitter breakdown voltage of the unit 55. This lower voltage is indicated in FIG. 4 as $V_T{}^2$, the second threshold level.

As soon as the input transistor 55 is re-energized, at the second threshold value $V_{T2}$, the voltage of the node point 56 falls to a relatively low level, for example, 1.2 volts, which is below the value necessary to sustain energization of the output transistor 70, which, as a result, returns to its relatively low conduction state. Consequently, the voltage appearing at the output terminal 80 then returns to the relatively high level $V_{11}$. Subsequently, the input voltage decreases to a value between $V_{T2}$ and $V_{MIN\,3}$ at which point the intermediate transistor 60 is de-energized. And finally, the input voltage returns to its initial value $V_{MIN\,3}$, in which condition, as specified above, the input transistor 55 is energized and the intermediate and output units 60 and 70 are both de-energized.

In summary, there has been described herein a novel circuit which can be switched from a first to a second quiescent state by exceeding a first input threshold level thereof and which can be switched back to the first state by decreasing the input signal to a second threshold level that is appreciably less than the first one.

A typical set of parameter values and operating voltage levels for a specific illustrative circuit made in accordance with the principles of the present invention is as follows:

| | |
|---|---|
| Transistors 55, 60 and 70 | Each Western Electric type 2414. |
| Sources 50 and 71 | Each 5 volts. |
| Resistors 51, 52, 61 and 72 | Each 400 ohms. |
| Resistor 53 | 200 ohms. |
| Diode 73 | Western Electric type 2414 transistor with its base shorted to its collector. |
| $V_{MIN\,3}$ | 0.8 volt. |
| $V_{T2}$ | 1.0 volt. |
| $V_{T1}$ | 1.2 volts. |
| $V_{MAX\,3}$ | 1.45 volts. |

It is to be understood that the above-described arrangements are only illustrative of the application of the principles of the present invention. Numerous other arrangements may be devised by those skilled in the art without departing from the spirit and scope of this invention. For example, $V_{T1}$ may be varied by varying the ratio between the value of the resistor 53 and the sum of the resistors 51 and 52. Also, $V_{T1}$ and $V_{T2}$ may be varied by, for example, adding a level-shifting diode or a resistor in series with the lower emitter of the intermediate transistor 60. Additionally, the difference $V_{T1}-V_{T2}$ may be increased by adding a level-shifting diode or a breakdown (Zener) diode in series with the base of the input transistor 55 and by increasing the ratio between the value of the resistor 53 and the sum of the resistors 51 and 52 accordingly. Furthermore, the diode 73 can be replaced with a resistor, thereby allowing a greater flexibility in the selection of the value $V_{11}$. Moreover, a relatively low-valued resistor may be inserted in series in the lead that connects the upper emitter of the transistor 60 to the collector of the output transistor 70, thereby to increase further the noise margin of the specific circuit shown in FIG. 3.

What is claimed is:

1. In combination, input, intermediate and output transistors each including base, emitter and collector electrodes, means connecting the collector electrode of said input transistor to the base electrode of said intermediate transistor and further connecting the emitter electrode of said intermediate transistor to the base electrode of said output transistor, input signal means connected to the emitter electrode of said input transistor, output means connected to the collector electrode of said output transistor, and means, including a feedback resistor connected between the base and collector electrodes of said input transistor, for applying operating potentials to the collector electrodes of said three transistors.

2. A combination as in claim 1 wherein said three transistors are of the same conductivity type.

3. A combination as in claim 2 wherein said input transistor includes a plurality of emitter electrodes and wherein said input signal means is connected to each of said emitter electrodes.

4. A combination as in claim 3 wherein said intermediate transistor includes an additional emitter electrode, and means connecting said additional emitter electrode of said intermediate transistor to the collector electrode of said output transistor.

5. A combination as in claim 4 further including a diode element connected between the collector and base electrodes of said output transistor, and a resistor connected between the base electrode of said output transistor and a point of reference potential.

6. In combination in a logic circuit, an array including input, intermediate and output transistors each comprising base, emitter and collector electrodes, said array being characterized by two stable states: one in which said input transistor is energized and said intermediate and output transistors are in their relatively low conduction conditions and the other in which said input transistor is deenergized and said intermediate and output transistors are in their relatively high conduction conditions, means connecting the collector electrode of said input transistor to the base electrode of said intermediate transistor and further connecting the emitter electrode of said intermediate transistor to the base electrode of said output transistor, a resistor connected between the base and collector electrodes of said input transistor, biasing means connected to the collector electrodes of said transistors, signal means connected to the emitter electrode of said input transistor, and a utilization circuit connected to the collector electrode of said output transistor.

7. Apparatus which is responsive to an input signal whose magnitude is equal to a first predetermined threshold level $V_{T1}$ for switching to a relatively low output voltage stable condition and which is responsive to an input signal whose magnitude is equal to a second predetermined threshold level $V_{T2}$ for switching to a relatively high output voltage stable condition, wherein $V_{T1}$ is substantially greater than $V_{T2}$, said apparatus comprising, input, intermediate and output N-P-N transistors each including base, emitter and collector electrodes, an input signal source connected to the emitter electrode of said input transistor, a first resistor connected between the base and collector electrodes of said input transistor, a bias source, second and third resistors connected in series between said bias source and the base electrode of said input transistor, a first direct electrical connection between the collector electrode of said input transistor and the base electrode of said intermediate transistor, a second direct electrical connection between the collector electrode of said intermediate transistor and a junction point between said second and third resistors, a third direct electrical connection between the emitter electrode of said intermediate transistor and the base electrode of said output transistor, a fourth resistor connected between the emitter electrode of said intermediate transistor and a point of reference potential, a fourth direct electrical connection between the emitter electrode of said output transistor and said point of reference potential, a fifth resistor connected between the collector electrode of said output transistor and said bias source, a diode element having its anode and cathode electrodes respectively connected to the collector and base electrodes of said output transistor, said intermediate transistor further including an additional emitter electrode, a fifth direct electrical connection between said additional emitter electrode and the collector electrode of said output transistor, said input transistor further including an additional emitter electrode, an additional input signal source connected to said additional emitter electrode of said input transistor, and a utilization device connected to the collector electrode of said output transistor.

8. In combination in a high noise margin logic circuit, an input transistor having base, emitter and collector electrodes, an input terminal connected to said emitter electrode, a feedback resistor connected between said base and collector electrodes for carrying a relatively high steady-state value of current therethrough when said input transistor is energized, bias source means connected to said base electrode, and output transistor means connected between said source and said collector electrode and characterized by a predetermined base-to-emitter breakdown voltage for reducing the current flow through said resistor to a relatively low steady-state value when said base-to-emitter breakdown voltage has been exceeded.

References Cited

UNITED STATES PATENTS 2,972,061 2/1961 Mueller ------------ 307—275

ARTHUR GAUSS, *Primary Examiner.*

R. H. PLOTKIN, *Assistant Examiner.*